United States Patent
Anikitchev et al.

(10) Patent No.: US 8,026,519 B1
(45) Date of Patent: Sep. 27, 2011

(54) SYSTEMS AND METHODS FOR FORMING A TIME-AVERAGED LINE IMAGE

(75) Inventors: Serguei Anikitchev, Belmont, CA (US); James T. McWhirter, San Jose, CA (US); Joseph E. Gortych, Sarasota, FL (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 12/925,517

(22) Filed: Oct. 22, 2010

(51) Int. Cl.
*H01L 29/04* (2006.01)

(52) U.S. Cl. ........ 257/59; 257/98; 257/72; 257/E21.413; 257/E21.134; 438/149; 438/487; 438/795; 438/476; 359/618; 359/619

(58) Field of Classification Search .................... 257/98, 257/72, E21.134, E21.413; 438/149, 487, 438/795, 476; 359/618, 619
See application file for complete search history.

(56) References Cited

U.S. PATENT DOCUMENTS

| | | | |
|---|---|---|---|
| 2004/0097103 A1* | 5/2004 | Imai et al. | 438/795 |
| 2009/0034071 A1* | 2/2009 | Jennings et al. | 359/494 |

\* cited by examiner

*Primary Examiner* — William Brewster
*Assistant Examiner* — Wilner Jean Baptiste
(74) *Attorney, Agent, or Firm* — Opticus IP Law, PLLC

(57) ABSTRACT

Systems and methods for forming a time-averaged line image having a relatively high amount of intensity uniformity along its length is disclosed. The method includes forming at an image plane a line image having a first amount of intensity non-uniformity in a long-axis direction and forming a secondary image that at least partially overlaps the primary image. The method also includes scanning the secondary image over at least a portion of the primary image and in the long-axis direction according to a scan profile to form a time-average modified line image having a second amount of intensity non-uniformity in the long-axis direction that is less than the first amount. For laser annealing a semiconductor wafer, the amount of line-image overlap for adjacent scans of a wafer scan path is substantially reduced, thereby increasing wafer throughput.

11 Claims, 14 Drawing Sheets

SYSTEMS AND METHODS FOR FORMING A TIME-AVERAGED LINE IMAGE

FIELD

The present disclosure relates generally to the use of line images, and in particular relates to systems and methods for forming a time-averaged line image having a relatively high degree of intensity uniformity.

BACKGROUND ART

There are a variety of applications that require the use of a line image having a relatively uniform intensity. One such application is laser thermal processing (LTP), also referred to in the art as laser spike annealing (LSA), or just "laser annealing." Laser annealing is used in semiconductor manufacturing for a variety of applications, including for activating dopants in select regions of devices (structures) formed in a semiconductor wafer when forming active microcircuits such as transistors.

One form of laser annealing uses a scanned line image from a light beam to heat the surface of the wafer to a temperature (the "annealing temperature") for a time long enough to activate the dopants in the semiconductor structures (e.g., source and drain regions) but short enough to prevent substantial dopant diffusion. The time that the wafer surface is at the annealing temperature is determined by the power density of the line image, as well as by the line-image width divided by the velocity at which the line image is scanned (the "scan velocity").

To achieve high wafer throughput in a commercial laser annealing system, the line image should be as long as possible, while also having a high power density. An example range for usable line-image dimensions is 5 mm to 100 mm in length (cross-scan direction) and 25 microns to 500 microns in width (scan direction). To achieve uniform annealing, it is also necessary for the intensity profile along the line-image length to be as uniform as possible, while non-uniformities along the line-image width are averaged out during the scanning process.

Typical semiconductor processing requirements call for the anneal temperature to be between 1000° C. and 1300° C., with a temperature uniformity of +/−3° C. To achieve this degree of temperature uniformity, the line image formed by the annealing light beam needs to have a relatively uniform intensity in the cross-scan direction, which under most conditions is less than a +/−5% intensity variation.

A $CO_2$ laser is a preferred light source for laser annealing applications because its wavelength (nominally 10.6 microns) is much longer than the size of most device features on the wafer. This is important because using a wavelength on the order of the size of the device features can lead to pattern-related variations in exposure. Thus, when the wafer is irradiated with the 10.6 micron wavelength light, the light scattering from the features is minimal, resulting in a more uniform exposure. In addition, a $CO_2$ laser emits a relatively high-intensity beam. However, the coherence length for a $CO_2$ laser is relatively long, typically several meters. This makes it unfeasible to use a binary optic approach to produce a line image with the required degree of intensity uniformity, i.e., ~10% (i.e., about +/−5%) based on principles of Kohler illumination.

SUMMARY

An aspect of the disclosure is a line-image-forming optical system that includes a primary laser system configured to provide a first laser beam. The optical system also includes a beam-conditioning optical system having an image plane and configured to receive the first laser beam and form therefrom a line image at the image plane. The line image has a long axis and a first amount of intensity non-uniformity along the long axis. The optical system also includes one of: a) a secondary laser system that forms a second laser beam, and b) a beam-splitting optical system configured to provide the second laser beam from a portion of the first laser beam. The optical system further includes a scanning optical system configured to receive the second laser beam and form therefrom a secondary image at the image plane that at least partially overlaps the line image. The scanning optical system scans the secondary image over at least a portion of the line image to form a time-averaged modified line image having a second amount of intensity non-uniformity that is less than the first amount.

A second aspect of the invention is a method of forming a line image having improved intensity uniformity at an image plane. The method includes forming at the image plane a line image having a first amount of intensity non-uniformity in a long-axis direction. The method also includes forming a secondary image that at least partially overlaps the primary image. The method further includes scanning the secondary image over at least a portion of the primary image and in the long-axis direction according to a scan profile to form a time-average modified line image having a second amount of intensity non-uniformity in the long-axis direction that is less than the first amount.

Additional features and advantages of the disclosure will be set forth in the detailed description which follows, and in part will be readily apparent to those skilled in the art from that description or recognized by practicing the disclosure as described herein, including the detailed description which follows, the claims, as well as the appended drawings.

It is to be understood that both the foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

DETAILED DESCRIPTION

Reference is now made in detail to embodiments of the disclosure, examples of which are illustrated in the accompanying drawings. Whenever possible, the same or like reference numbers and symbols are used throughout the drawings to refer to the same or like parts.

It is noted that the term "line image" is used herein in to generally denote an elongate intensity distribution of light formed by a light beam at an image plane, and thus does not necessarily require an associated "object" in the classical sense. For example, the line image can be formed using beam-conditioning optics that cause the aforementioned light beam to come to a line focus at the image plane.

Also, a "time-averaged line image" is defined herein as a line image whose intensity is measured over a period of time and is averaged over that period of time.

Line-Image-Forming Optical System

Figure 1A:
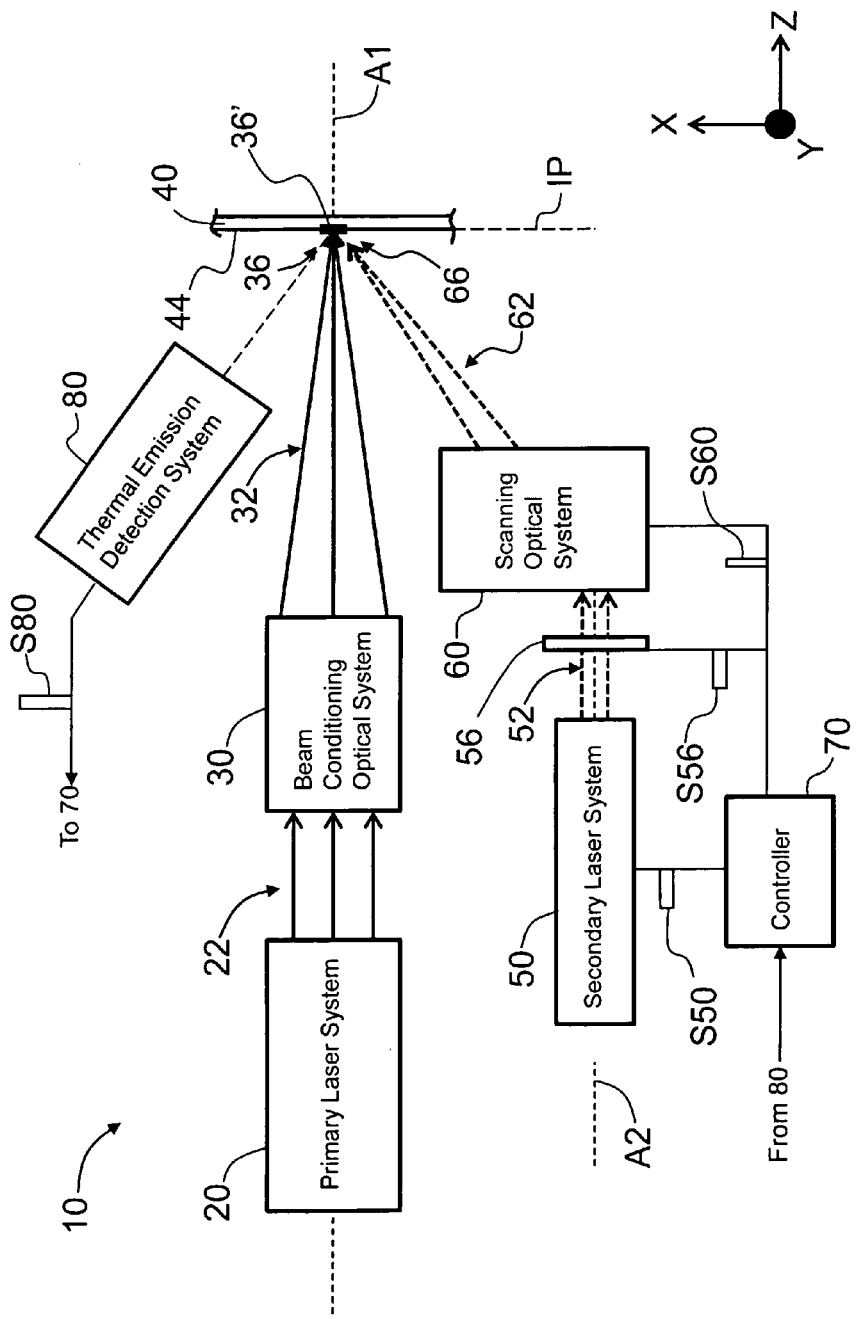
FIG. 1A is a general schematic diagram of an example line-image-forming optical system according to the present disclosure that uses primary and secondary laser systems.

FIG. 1A is a general schematic diagram of an example line-image-forming optical system ("system") 10 according to the present disclosure. A Cartesian coordinate system is shown for the sake of reference. System 10 includes a primary laser system 20 that emits an initial primary laser beam 22 along an optical axis A1 that runs in the Z-direction. A beam conditioning optical system 30 is arranged along optical axis A1 downstream of primary laser system 20. Beam conditioning optical system 30 is configured to received initial primary laser beam 22 and form therefrom a line-image-forming beam 32 (also referred to as hereinafter as the "primary light beam") that forms a line image 36 (also referred to as the "primary image") at an image plane IP that lies in an X-Y plane.

Figure 2:
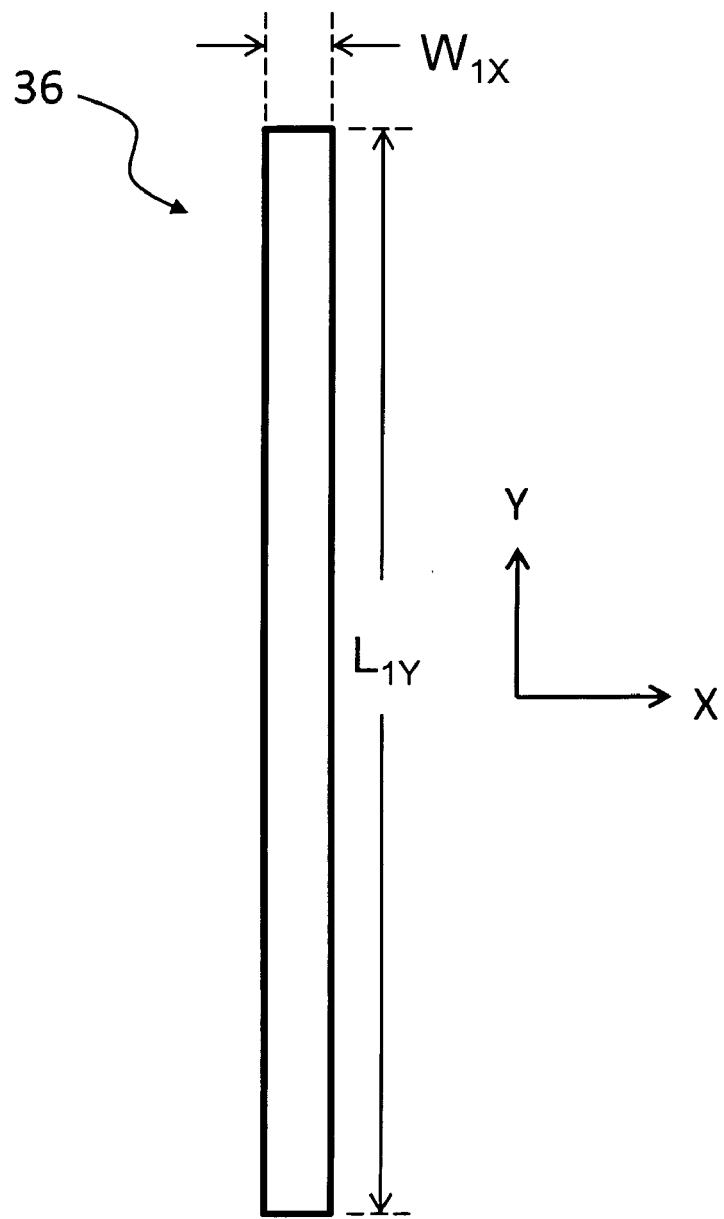
FIG. 2 is a schematic view of an idealized line image.

FIG. 2 is a schematic view of an idealized line image 36 as formed at image plane IP. Idealized line image 36 has a "short axis" width $W_{1X}$ and a "long axis" length $L_{1Y}$. Idealized line image 36 of FIG. 2 also depicts an ideal "flat top" intensity contour plot for line image 36.

Figure 3A:
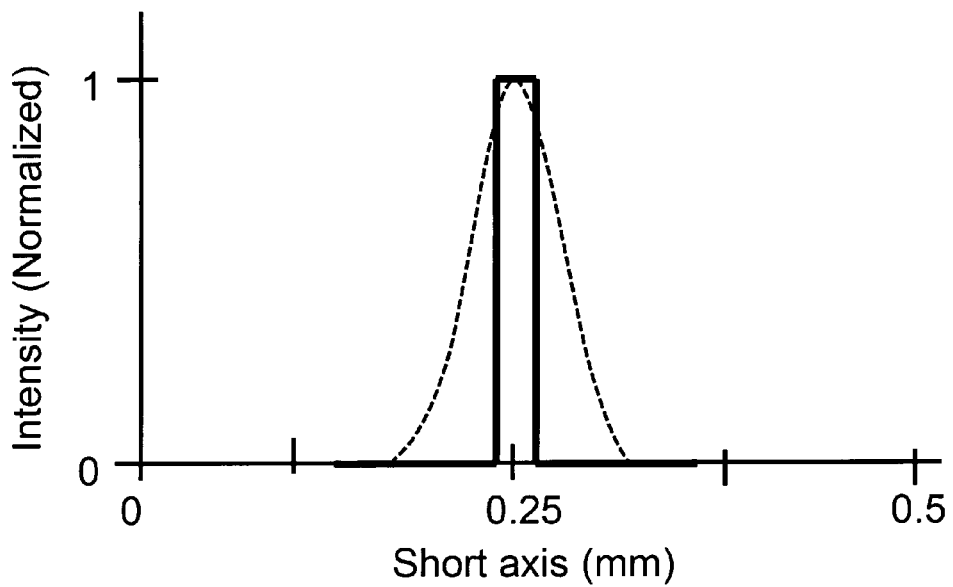
FIG. 3A and FIG. 3B are idealized normalized intensity vs. distance (mm) plots for the idealized line image of FIG. 2 taken along the short-axis (scan) direction and the long-axis (cross-scan) direction, respectively, with the square (solid line) and Gaussian (dashed line) representing examples of idealized intensity profiles.
Figure 3B:
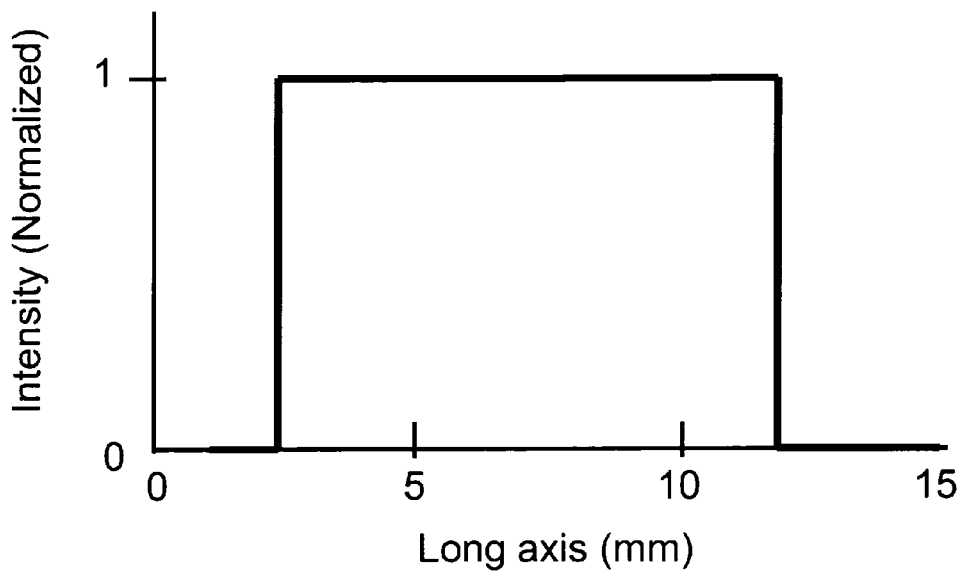

FIG. 3A and FIG. 3B are idealized normalized intensity vs. distance (mm) plots for an ideal line image 36 having a width $W_{1X}$ ~0.025 mm and a length $L_{1Y}$ ~10 mm. FIG. 2 can be thought of as an idealized intensity contour plot that has a single, sharply defined intensity contour at a normalized intensity of 1.

With reference again to FIG. 3A, note that a smooth profile with a single maximum along the short axis (e.g., a Gaussian or near-Gaussian) as shown by the dashed line curve is also a suitable short-axis intensity profile for ideal image 36.

With reference again to FIG. 1A, beam conditioning optical system 30 can include lenses, mirrors, apertures, filters, active optical elements (e.g., variable attenuators, etc.) and combinations thereof. Example beam conditioning optical systems 30 are disclosed in U.S. Pat. Nos. 7,514,305, 7,494, 942, 7,399,945 and 6,366,308, and U.S. patent application Ser. No. 12/800,203, all of which are incorporated by reference herein.

In an example, a planar workpiece 40 having a surface 44 is arranged at image plane IP so that that the workpiece surface lies substantially in the image plane. In an example, workpiece 40 comprises a semiconductor wafer.

The description of system 10 up until now describes a conventional line-image-forming optical system. However, with continuing reference to FIG. 1A, system 10 according to the present disclosure also includes a secondary laser system 50 that emits an initial secondary laser beam 52 along an optical axis A2 that also runs in the Z-direction and thus parallel to axis A1. System 10 also includes a scanning optical system 60 arranged along optical axis A2 and downstream of secondary laser system 50. In an example embodiment, a variable attenuator 56 is arranged between secondary laser system 50 and scanning optical system 60.

System 10 further includes a controller 70 operably connected to secondary laser system 50, to optional variable attenuator 56, and to scanning optical system 60 and is configured to coordinate the operation of these two systems and optionally the variable attenuator as part of system 10 via electrical control signals S50, S56 (optionally), and S60, as described below.

Figure 4:
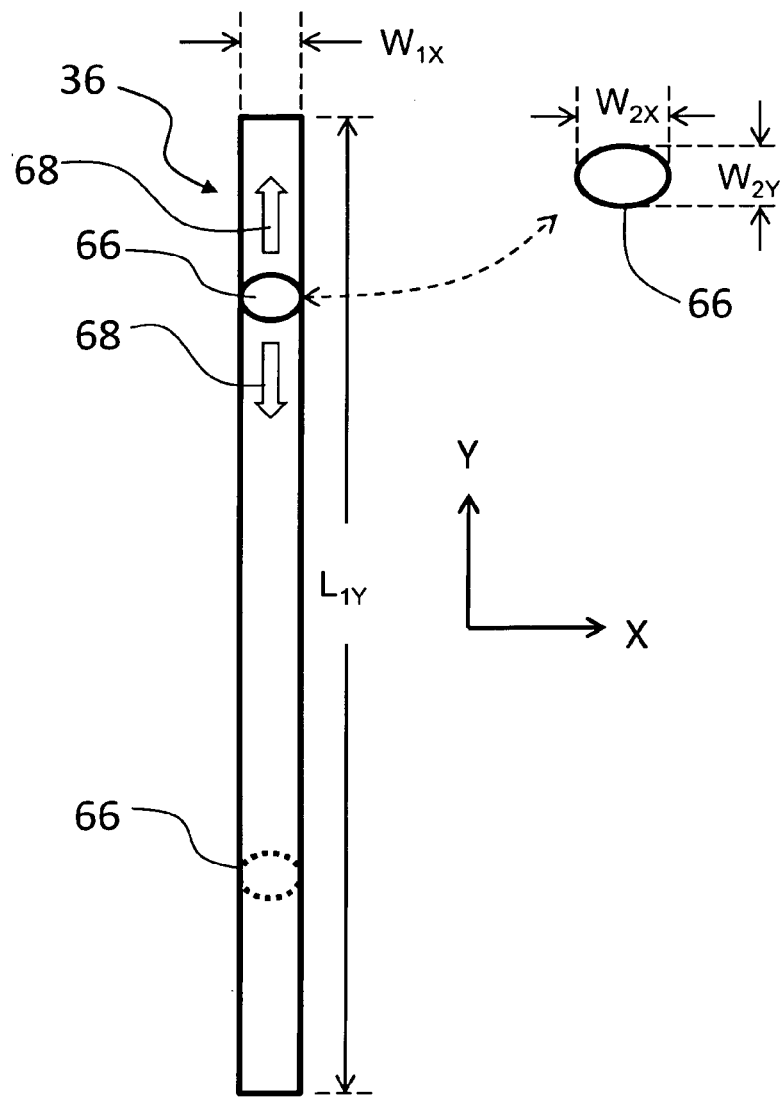
FIG. 4 is similar to FIG. 2 but shows a secondary image that is smaller than the line image (primary image) and that overlaps the line image, wherein the secondary image is scanned along the long-axis direction of the primary image according to a scan profile.

Scanning optical system 60 is configured to receive initial secondary laser beam 52 and form therefrom a scanning laser beam 62 (also referred to as a "secondary light beam") that forms a secondary image 66 at image plane IP. With reference to FIG. 4, scanning optical system 60 is configured to scan secondary image 66 based on a scan profile over at least a portion of line image 36. The scan profile scans the primary image in the direction of the long axis (i.e., the Y-direction), as illustrated by Y-direction arrows 68. Secondary image 66 is generally smaller than primary image 36 (i.e., has a smaller area) and at least partially overlaps primary image 36 when the secondary image is stationary. In the example illustrated in FIG. 4, secondary image 66 completely overlaps line image 36, i.e., the secondary image falls within the line image. A "partially overlapping" secondary image would extend beyond a boundary of line image 36. Thus, the secondary image 66 is said to "at least partially overlap" line image 36, where in some cases this means that the secondary image completely overlaps the line image as shown in FIG. 4. Consequently, a "complete overlap" of the secondary and line images as this phrase is understood and used herein does not mean that the secondary image completely covers the line image. In some instances, secondary image 66 completely overlaps line image 36 and falls well within the line image 36, i.e., the secondary image has a width $W_{2X}$ that is substantially smaller than the line image short-axis width $W_{1X}$. In an example, the dimensions of line image 36 and secondary image 66 are defined by a select intensity value (i.e., an intensity threshold).

The purpose of scanning secondary image 66 relative to primary image 36 based on a scan profile is described in greater detail below. Secondary image 66 can be any one of a variety of general shapes such as a line, round, oval, rectangular, square, etc. that will accomplish the function of forming a modified line image 36', as described below.

Figure 1B:
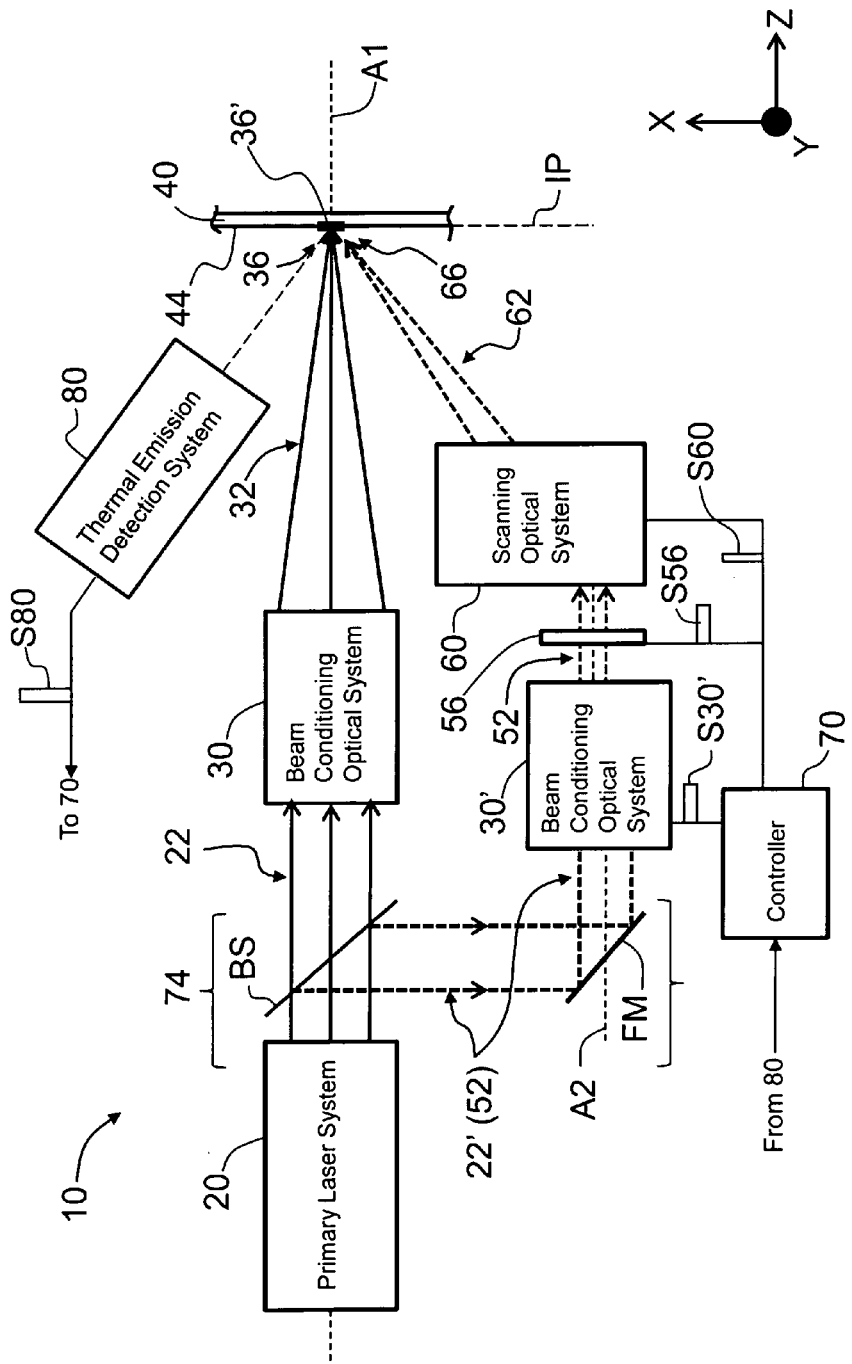
FIG. 1B is similar to FIG. 1A and illustrates an example embodiment where the secondary laser beam is formed by diverting a portion of the primary laser beam.

FIG. 1B is similar to FIG. 1A and illustrates an example embodiment of system 10 where initial secondary laser beam 52 is formed by diverting a portion of initial primary laser beam 22. In an example, this is accomplished by disposing a beamsplitter BS along axis A1 to divert a portion 22' of the initial primary laser beam 22. A fold mirror FM is optionally used to direct laser beam portion 22' along axis A2 so that this laser beam portion can serve as the initial secondary laser beam 52. Beam splitter BS and fold mirror FM constitute one example of a beam-splitting optical system 74 that directs a portion 22' of initial primary laser beam 22 to form initial secondary laser beam 52. Other variations of beam-splitting optical system 74 are contemplated herein, including where beam splitter BS is replaced by a small mirror (not shown) that deflects a small piece of initial primary laser beam 22 to fold mirror FM.

In an example, laser beam portion 22' is processed by an optional beam conditioning optical system 30' configured to form a conditioned secondary light beam 52, i.e., one having a more uniform intensity over its cross-section than laser beam portion 22'. Beam conditioning optical system 30' is similar to beam conditioning optical system 30 in that it can include lenses, mirrors, apertures, filters, active optical elements (e.g., variable attenuators, etc.) and combinations thereof, to form a suitable light beam 52 for use by scanning optical system 60 to form a suitable secondary light beam 62. In an example, controller 70 is electrically connected to beam conditioning optical system 30' to control any active optical components therein via a control signal S30'.

Line Image Intensity Uniformity

Figure 5:
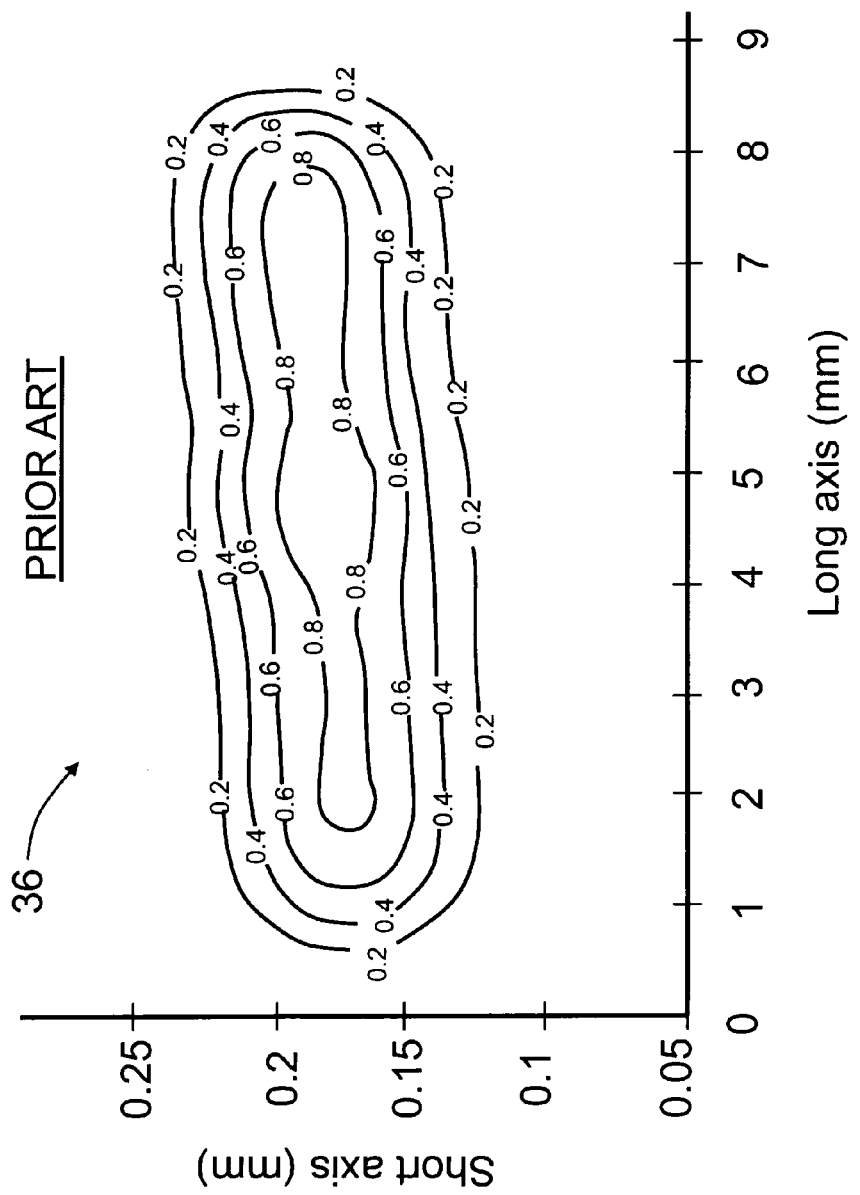
FIG. 5 is a prior art intensity contour plot obtained by measuring the thermal emission of a substrate irradiated with an example line image formed by a conventional line-image-forming system.

FIG. 5 is a prior art intensity contour plot obtained by measuring the thermal emission of a semiconductor wafer irradiated with an example line image 36 formed by a conventional line-image-forming system. The intensity contours are based on a normalized intensity. The short-axis direction is expanded to emphasize the short-axis intensity variations.

Figure 6A:
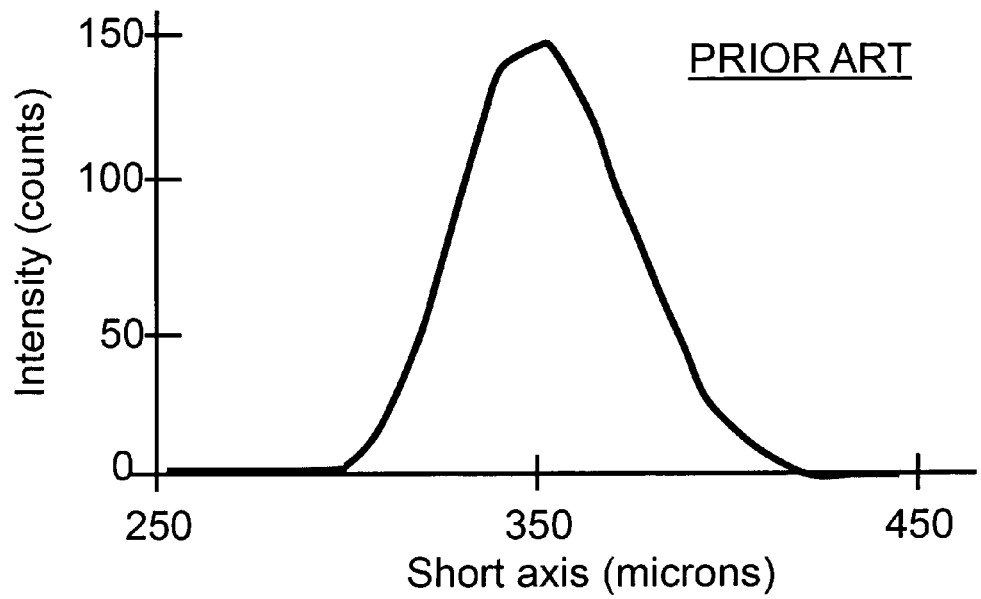
FIG. 6A and FIG. 6B plot the intensity vs. distance in the short-axis direction and long-axis directions, respectively, for the prior art intensity contour plot of FIG. 5.
Figure 6B:
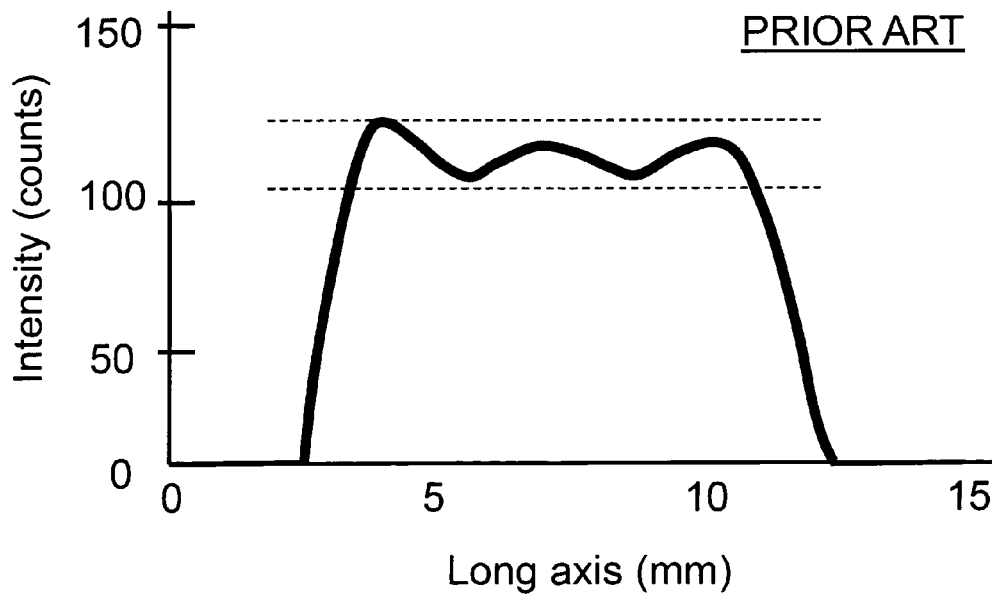

FIG. 6A and FIG. 6B plot the intensity vs. distance in the short-axis direction and long-axis directions, respectively, for the intensity contour plot of line image 36 of FIG. 5.

With reference to FIG. 5 and FIGS. 6A and 6B, the long-axis intensity profile shows about a 20% variation in intensity in the range indicated by the parallel dashed lines of FIG. 6B. The line image intensity profile in the long-axis direction includes intensity variations that can be attributed to a number of different factors, such as diffraction, optical aberrations, optical misalignment or a combination thereof. Dynamic aberrations and/or misalignments typically give rise to intensity non-uniformities in the form of a time-varying tilt along the long axis. This phenomenon is sometimes referred to as "beam wobble." The intensity profile of line image 36 can also have a static tilt due to for example residual heating effects or a static misalignment.

Substantial long-axis intensity non-uniformities (e.g., 20%) are not acceptable for certain applications such as laser annealing, wherein a high degree of temperature uniformity on a wafer is required during the annealing process.

Figure 7A:
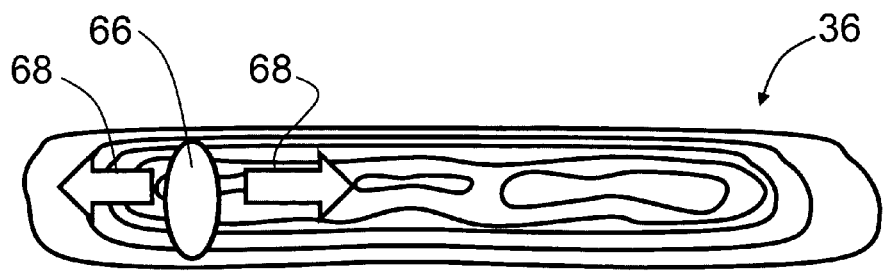
FIG. 7A is an intensity contour plot of an example line image having a relatively high degree of intensity non-uniformity along its length, and also showing an example secondary image being scanned along the line image long axis.
Figure 7B:
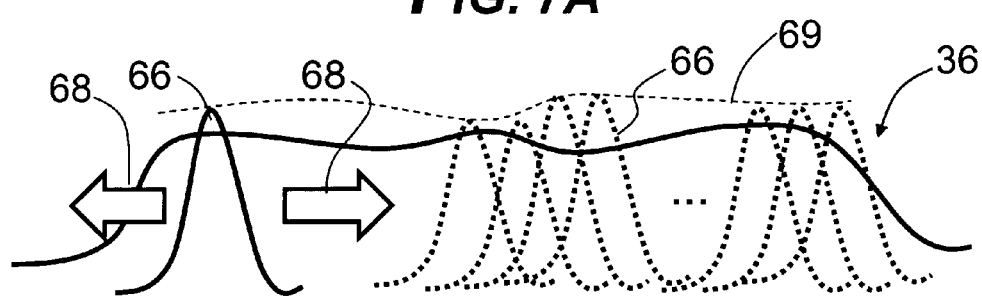
FIG. 7B is an intensity vs. distance plot in the long-axis direction of the line image of FIG. 7A, and shows the secondary image being scanned along the line image long axis and the variation in secondary image intensity (dashed line) according to the scan profile.

FIG. 7A is an intensity contour plot of an example line image 36 having a relatively high degree of intensity non-uniformity along its long axis, and also shows an example secondary image 66 being scanned along the line image long axis. FIG. 7B is an intensity vs. distance plot in the long-axis direction of the line image of FIG. 7A, and shows the secondary image being scanned along the line image long axis as indicated by arrows 68, and the variation in secondary image intensity (dashed line 69) along the scan profile.

System 10 is configured for improving the intensity uniformity of line image 36 formed by just primary laser system 10 and beam conditioning optical system 30 by supplying additional (secondary) intensity via secondary image 66 where the line-image intensity is low. This in effect fills in the otherwise non-uniform intensity profile of line image 36 to form a modified line image 36' that is a time-averaged combination of primary image 36 and a selectively scanned secondary image 66.

Figure 8A:
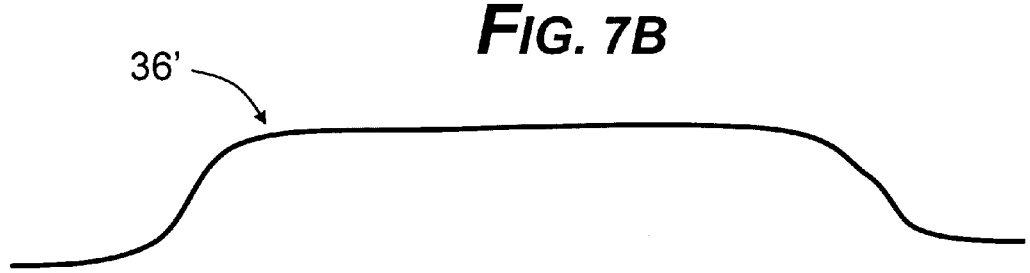
FIG. 8A is an intensity vs. distance plot in the long-axis direction of the line image that shows the resultant time-averaged modified line image intensity profile formed by scanning the secondary image according to a scan profile along the long-axis direction.

FIG. 8A is an intensity vs. distance plot in the long-axis direction of the modified line image 36' and shows the resultant time-averaged modified line-image intensity profile formed by scanning the secondary image according to a scan profile along the long-axis direction. The resultant modified line image 36' has a time-averaged intensity profile closer to the ideal "flat top" intensity profile shown in FIGS. 2, 3A and 3B.

Figure 8B:
FIG. 8B is an intensity contour plot corresponding to the modified line image of FIG. 8A, showing a greater degree of intensity uniformity along the long-axis direction for the time-averaged modified line image as compared to the intensity contour plot of FIG. 7A for the conventionally formed line image.

FIG. 8B is an intensity contour plot corresponding to the modified line image 36' of FIG. 8A. The intensity contour plot of FIG. 8B has a greater degree of intensity uniformity in the long-axis direction as compared to the intensity contour plot of FIG. 7A.

Modified line image 36' is time-averaged to achieve the required level of intensity uniformity, e.g., +/−5% or better.

The time-averaging can be taken over a single scan pass or multiple scan passes of secondary image 66 over at least a portion of primary image 36, or over a single scan pass of the length of the primary image, or over multiple passes in the same direction, or multiple passes back and forth (i.e., in opposite directions) over the primary image.

Where system 10 is used for laser annealing, primary laser system 20 can include a high-power $CO_2$ laser and secondary laser system 50 can include a low-power $CO_2$ laser. Or, as discussed above in connection with FIG. 1B, a single high-power $CO_2$ laser can be used to form both the primary and secondary light beams 32 and 62.

In one example, secondary image 66 is scanned along the long axis of primary image 36 via the operation of scanning optical system 60, with the scanning time $t_s$ of the scanned secondary image 66 being about the same as or shorter than the dwell time $t_d$ of primary image 36. Here, the scanning time $t_s$ is the time it takes to scan secondary image 66 over the scan path, and the dwell time to is the amount of time that line image 36 remains at a given location (point) at image plane IP or at a point on workpiece surface 44 when a workpiece 40 is arranged in the image plane.

In the case where line image 36 is scanned relative to a fixed image plane IP or relative to a workpiece arranged in the image plane (e.g., the workpiece is moved relative to the line image), then the dwell time $t_d$ is the amount of time the line image covers a given point in the image plane or on the workpiece.

Using the above systems and methods, modified line image 36' can have an amount of time-averaged intensity non-uniformity that is less than the amount of intensity non-uniformity in line image 36. This can be accomplished by: i) maintaining secondary image 66 and at a substantially constant power and adjusting (i.e., speeding up and/or slowing down) the secondary-image scanning, ii) selectively changing the power of secondary image and scanning it at a substantially constant velocity, or ii) by a combination of methods i) and ii).

Where the amount of intensity of secondary image 66 needs to be varied in a select manner, adjustable attenuator 56 can be used and controlled by controller 70 via a control signal S56. Alternatively, or in combination therewith, controller 70 can modulate secondary laser system 50 using control signal S50

In an example, the scan profile can be configured so that secondary image 66 is scanned only over select portions of line image 36, i.e., only those portions where additional intensity is needed. This can be accomplished by the secondary image 66 having substantially "zero intensity" during select portions of the scan profile where no extra intensity needs to be added to the primary image.

Power Requirements for Laser Annealing

Typical intensity variations in a conventional line image for laser annealing applications are usually between 10% to 20% (i.e., +/−5% to +/−10%). Process temperature variations due to variations in the power density in the line image are accounted for through a power density variation parameter $\mu(y)$, where y is the long-axis dimension of line image 36. A typical value for $\mu(y)$ at an annealing temperature of about 1,300° C. is about 1% to 2%. Typical dimensions for primary image 36 are length $L_{1Y}=10$ mm and width $W_{1X}=0.1$ mm, while a typical power P of primary laser beam 22 is 500 W. Thus, an example power density or intensity $I_1$ (power $P_1$ per area $A_1$) associated with primary image 36 is:

$$I_1 = P_1/A_1 = P/(L_{1Y} \cdot W_{1X}) = (500 \text{ W})/([10 \text{ mm}] \cdot [0.1 \text{ mm}]) = 500 \text{ W/mm}^2.$$

The energy density is given by $E = I_1 \cdot t_d$, where $t_d$ is the dwell time for the primary light beam. The variation of energy density is then $$\Delta E = \mu \cdot I_1 \cdot t_d.$$

Secondary laser system 50 needs to provide a secondary image 66 having an energy density E sufficient to compensate for the variation of energy density $\Delta E$ in primary image 36.

In an example, the width $W_{2X}$ of secondary image 66 is substantially the same as the width $W_{1X}$ of primary image 36, i.e., $W_{1X} \sim W_{2X}$. In this example, secondary image 66 has an area $A_2 = W_{2X} \cdot W_{2Y} = W_{1X} \cdot W_{2Y}$. Also in an example, secondary image 66 is scanned over primary image 36 in a scan time $t_s$ that is a fraction of the primary light beam dwell time $t_d$, so that $t_s = v \cdot t_d$, where $0 < v < 1$.

The power $P_2$ that needs to be provided by secondary laser system 50 is estimated from the equation:

$$\text{Max}\{(\mu)\} \cdot I_1 \cdot t_d = (P_2 \cdot t_s)/(W_{1X} \cdot W_{2Y})$$

Rearranging and using $I_1 = 1/(W_{1X} \cdot L_{1Y})$, P2 can be expressed as:

$$P_2 = P_1 \{W_{2Y}/L_{1Y}\} \cdot \{(\text{Max}(\mu))/v\}$$

Using $P_1 = 500$ W, max $(\mu) = 0.02$, $v = 0.1$, $W_{2Y} = 0.1$ mm, $L_{1Y} = 10$ mm, the secondary power $P_2 \sim 1$ W. Using a comfortable safety margin of 10× yields $P_2 \sim 10$ W. This amount of secondary power is readily provided by a number of commercially available $CO_2$ lasers, and can also be obtained by re-directing a portion of a high-power $CO_2$ light beam.

Secondary Image Scanning and Control

For constant velocity scanning of secondary image 66 over at least a portion of primary image 36 at a scanning velocity V in the long-axis direction (i.e., Y-direction), the power in the secondary image 66 as a function of y is given by:

$$v \cdot P_2(y) = P_1 \cdot \mu(y) \cdot [W_{1X}/W_{1Y}]$$

where the y position of the center (e.g., centroid) of secondary image 66 at a given scanning time $t_s$ is given by $y = V \cdot t_s$.

For modulation of the dwell time $t_d$, v goes from being a constant to being a function of the distance along the primary image, i.e., $v \to v(y)$.

As described above, static and dynamic line-image non-uniformities can arise. The static non-uniformities can be caused by beam modulation, residual heat, etc, while the dynamic non-uniformities (so-called beam wobble) can be caused by variations of the refractive index in a beam path and vibrations of the optics. Frequencies of the dynamic variations in line-image uniformity typically do not exceed 100 Hz.

One method of compensating for static non-uniformities in primary image 36 includes scanning the primary image over a set of one or more test (blanket) wafers. The method also includes measuring the thermal emission from each wafer to obtain a measure of the variation in intensity of the primary image 36 in the long-axis direction. Here, it is assumed that the emission from the wafer is proportional to the intensity of primary image 36. More precisely, the wafer temperature is proportional to the intensity, with the emission from the heated wafer being related to the temperature through Planck's equation. This assumption is generally appropriate for the intensity measurements contemplated herein.

Statistical analysis (e.g., averaging) of the wafer measurements can be used to determine a representative primary image 36R (i.e., representative intensity profile) for primary image 36, which in turn can be used to define the scan profile for secondary image 66 that substantially compensates for the static non-uniformities in representative primary image 36R.

The resultant representative primary image 36R can be stored in memory (e.g., in controller 70) and can be used for temperature-based close loop control used when scanning product wafers.

To account for any drifts in the operating parameters of system 10, such as aging of the laser in primary laser system 10 and the components in beam conditioning optical system 20, the representative primary image 36R can be periodically updated, e.g., by performing more wafer exposures and measurements using primary image 36. The representative primary image 36R can also be updated periodically as needed in view of certain events, such as after major maintenance procedures involving system 10, such as optical re-alignments, replacement of optical components, servicing or replacing lasers, etc.

To compensate for time-varying intensity non-uniformities in line image 36, the scan profile for secondary image 66 can be controlled using a real-time feedback system. With reference again to FIG. 1A, in an example, system 10 includes a thermal emission detection system 80 (e.g., a CMOS imaging camera or a CCD array) capable of detecting thermal emissions at temperatures of about 1,300° C. to capture an emission image (emission profile) along the long axis. Thermal emission detection system 80 is arranged to view primary image 36 and capture an emission image thereof and generate an electrical signal S80 representative of the captured emission image. Electrical signal S80 is provided to controller 70, which in an example embodiment is configured to store and process the emission images embodied in electrical signal 580. In one example, thermal emission detection system 80 images at a rate of 200 frames per second or greater to provide a sufficient sampling frequency for intensity variations that occur in primary image 36.

Controller 70 processes electrical signals S80 and performs a beam profile analysis (e.g., statistical averaging of emission images and conversion of measured emission to intensity) to form a representative primary image 36R. The real-time compensation of the representative primary image 36R is then accomplished by calculating a secondary image scan profile based on the representative primary image 36R. Controller 70 then provides control signal S50 to secondary laser system and control signal S60 to scanning optical system 60 to carry out the secondary image scanning according to the calculated secondary image scan profile.

In an example embodiment, Controller 70 is or includes a computer such as a personal computer or workstation, or a stand-alone control system utilizing any combination of programmable logic devices such as any one of a number of types of micro-processors, central processing units (CPUs), floating point gate arrays (FPGAs) or application specific integrated circuits (ASICs). In addition to one or more such programmable logic devices, controller 70 also may include a bus architecture to connect the processor to a memory device, such as a hard disk drive, and suitable input and output devices (e.g., a keyboard and a display, respectively).

In an example, the FPGA can be configured to perform emission image analysis and a real-time controller unit with shared memory and direct memory access (DMA) data transfer to the shared memory.

In a modification to this embodiment, controller 70 may utilize distributed logic, with an image acquisition and processing sub-system, containing image acquisition hardware and utilizing a programmable logic device (e.g., an FPGA) for control and processing of the thermal image data. In an example, this sub-system communicates with a real time control sub-system, which could utilize a micro-processor and related peripherals, running a real-time operating system. The real time control sub-system can be utilized to communicate between other system controllers, as well as perform command and control functions related to the image processing and control of the secondary image. Communication between sub-systems could be through any combination of; a communications interface (e.g., Ethernet, RS422), a shared logic buss and a shared memory bus.

Figure 9:
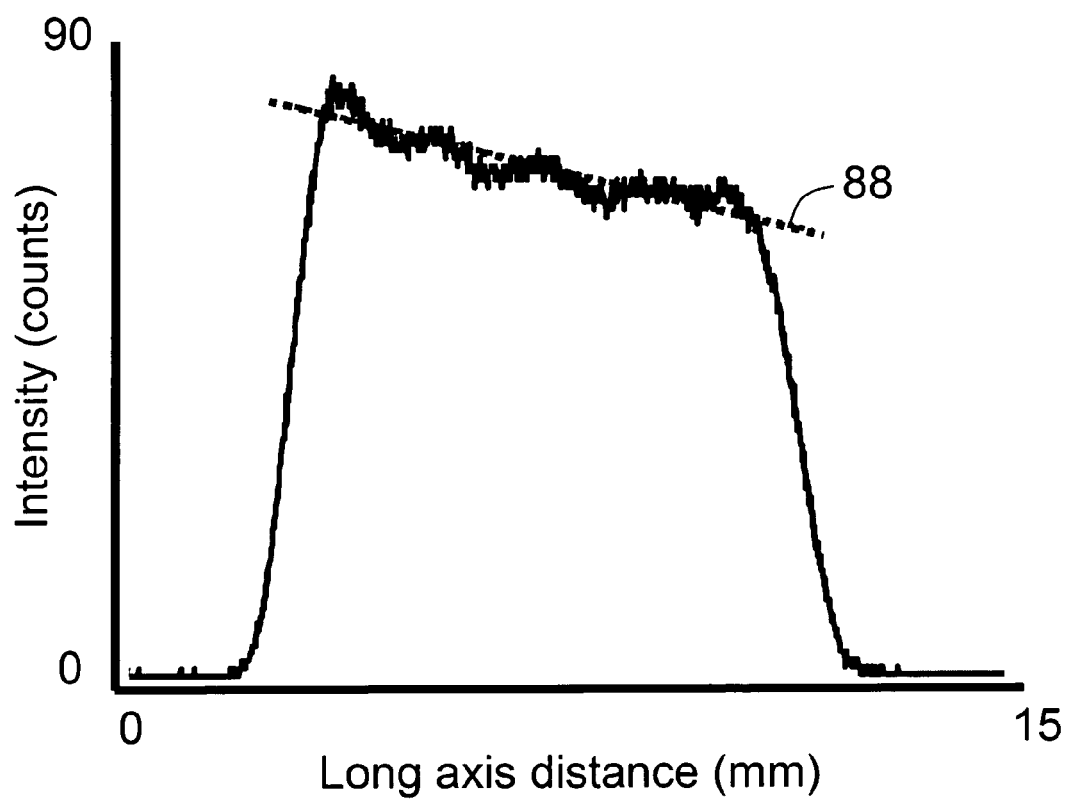
FIG. 9 is a plot of the intensity (counts) vs. distance (mm) in the long-axis direction, illustrating an example tilt in the intensity profile along the line image long axis.

Dynamic instabilities in the intensity of primary image 36 often take the form of a linear intensity tilt, as shown in the FIG. 9, which plots the intensity (counts) vs. long-axis distance (mm). The tilted nature of the intensity profile is shown via dotted line 88. The tilt of the intensity profile typically changes with time, usually with a frequency of about 100 Hz or less. The random nature of certain types of dynamic intensity variations such as the aforementioned tilting precludes measuring them beforehand and then trying to compensate using secondary image 66.

Figure 10A:
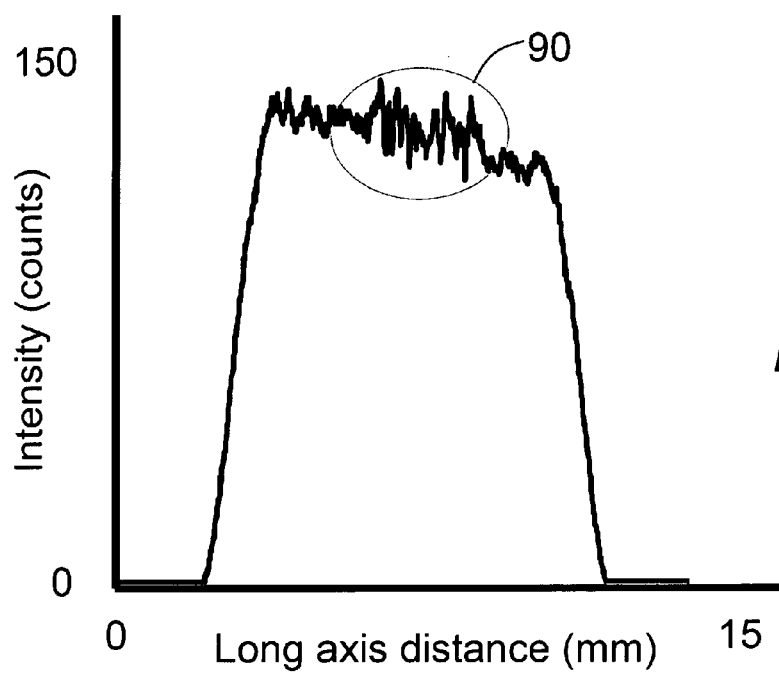
FIGS. 10A and 10B are plots similar to FIG. 9 for a measured thermal emission image for a line image formed on a patterned silicon wafer and showing the resultant high-spatial-frequency features caused by light scattering from the wafer pattern.
Figure 10B:
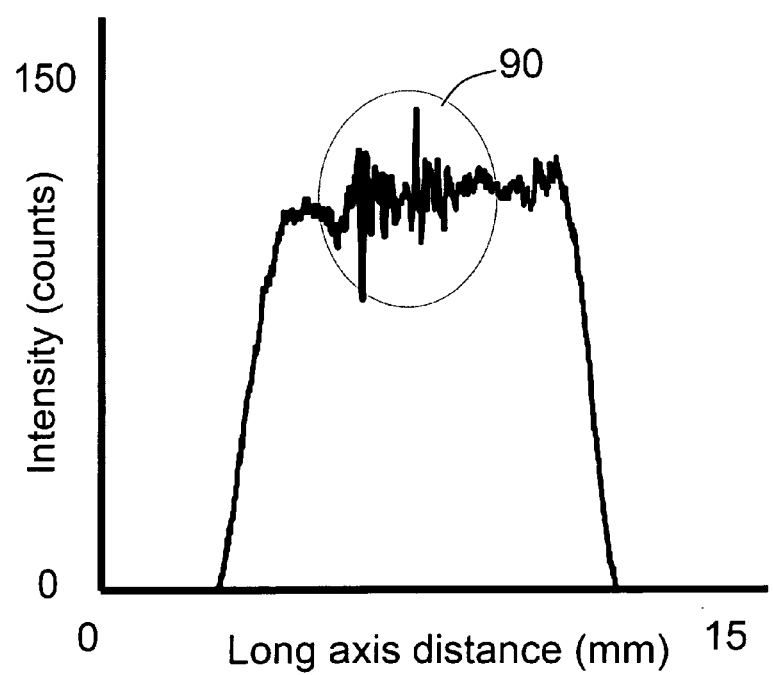

Emission images can be very complex when measured on patterned wafers. FIGS. 10A and 10B are representative plots similar to FIG. 9 for the measured emission image of line image 36 formed on a patterned silicon wafer. Each plot includes a region 90 where the emission intensity is modulated at a relatively high spatial frequency due to the wafer pattern formed by various device structures (lines, shapes, vias, kerfs, alignment marks, etc.) formed when processing the wafer to form semiconductor chips (i.e., integrated circuits).

Figure 10C:
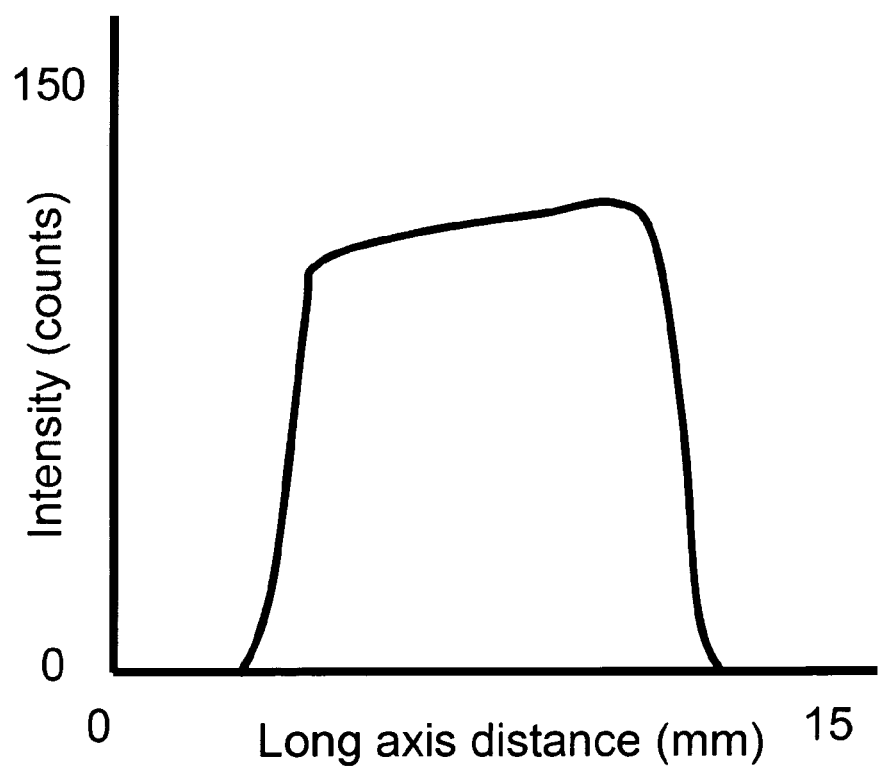
FIG. 10C is similar to FIG. 10A and FIG. 10B and illustrates where the emission image has been filtered with a low-pass filter to remove the high-frequency modulation caused by light scattering by the wafer pattern.

Thus, in an example, the emission images from thermal emission detection system 80 as embodied in signals S80 are low-pass filtered and then processed in a manner that allows for comparison to the static representative primary image 36R. The appropriate adjustment is then made to the scanning profile for secondary image 66. FIG. 10C is similar to FIG. 10B, but where the emission image (signal S80) has been filtered with a low-pass filter to remove the high-frequency modulation caused by the wafer pattern.

For changes to primary image 36 that occur at a given frequency f (e.g., 100 Hz), the emission image acquisition and subsequent secondary image scan profile calculation need to occur with a frequency of about 2f (e.g., 200 Hz).

Laser Annealing System

Laser annealing in semiconductor processing is typically performed on patterned wafers. The absorption on patterned wafers varies with the pattern dimensions, the pattern density and the laser wavelength. It has been shown that laser annealing with a wavelength much longer than the pattern dimensions reduces scattering and thus increases wafer absorption.

Figure 11:
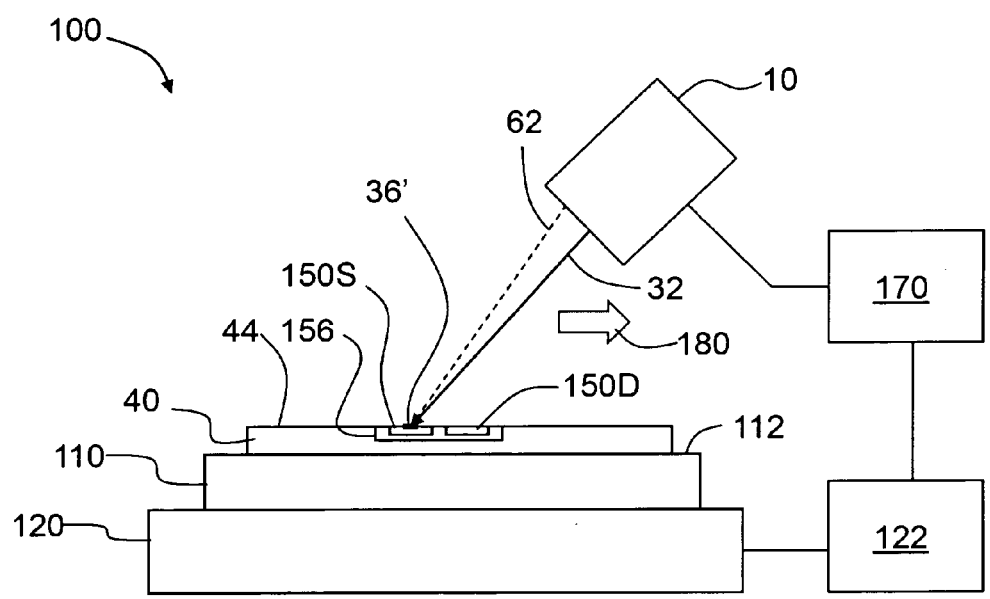
FIG. 11 is a schematic diagram of an example laser annealing system that includes the line-image-forming system of the present disclosure for forming a scanned modified line image with relatively high intensity uniformity for thermal annealing a semiconductor wafer.

FIG. 11 is a schematic diagram of a laser annealing system 100 that includes the line-image-forming system 10 of the present disclosure. An example laser annealing system 100 for which the line-image-forming optical system 10 is suitable for use is described in, for example, U.S. Pat. Nos. 7,612,372, 7,154,066 and 6,747,245, which patents are incorporated by reference herein.

System 10 is shown generating primary light beam 32 and scanned secondary light beam 62 to form modified line image 36'. Primary and secondary light beams 32 and 62 have a wavelength (e.g., nominally 10.6 microns from either the same or from respective $CO_2$ lasers) that is/are capable of heating wafer 40 under select conditions. Such conditions include, for example, heating wafer 40, or irradiating the wafer with radiation from a pre-heat source (not shown), with the radiation having a bandgap energy greater than the semiconductor bandgap energy of the wafer, thereby causing the wafer to absorb primary and secondary light beams 32 and 62 to a degree sufficient to heat the wafer to annealing temperatures. An example of irradiating the wafer with a third light source to make the wafer more absorbent at $CO_2$ laser wavelengths is described in U.S. Pat. No. 7,098,155, 7,148,159 and 7,482,254, all of which are incorporated by reference herein. In a preferred embodiment, primary and secondary light beams 32 and 61 have the same or substantially the same wavelength.

Wafer 40 is supported by a chuck 110 having an upper surface 112. In an example, chuck 110 is configured to heat wafer 40. Chuck 110 in turn is supported by a stage 120 that in turn is supported by a platen 130. In an example embodiment, chuck 110 is incorporated into stage 120. In another example embodiment, stage 120 is movable, including being translatable and rotatable.

Wafer 40 is shown by way of example as having semiconductor structures in the form of source and drain regions 150S and 150D formed at or near wafer surface 44 as part of a circuit (e.g., transistor) 156. Note that the relative size of the source and drain regions 150S and 150D in circuit 156 compared to the dimensions of wafer 40 is greatly exaggerated in FIG. 11 for ease of illustration. In practice, source and drain regions 150S and 150D are very shallow, having a depth into the wafer of about one micron or less. Source and drain regions 150S and 150D constitute the above-mentioned wafer patterning that can cause high-frequency modulation when capturing an emission image of primary image 36.

In an example embodiment, apparatus 100 further includes a controller 170 electrically connected to system 10 (including controller 70 therein; see FIGS. 1A and 1B) and to a stage controller 122. Stage controller 122 is electrically coupled to stage 120 and is configured to control the movement of the stage via instructions from controller 170. Controller 170 is configured to control the operation of apparatus 100 generally, and in particular system 10 and stage controller 122.

In an example embodiment, controller 170 is or includes a computer, such as a personal computer or workstation, available from any one of a number of well-known computer companies such as Dell Computer, Inc., of Austin Tex. Controller 170 preferably includes any of a number of commercially available micro-processors, a suitable bus architecture to connect the processor to a memory device, such as a hard disk drive, and suitable input and output devices (e.g., a keyboard and a display, respectively).

With continuing reference to FIG. 11 and also to FIGS. 1A and 1B, primary light beam 32 is directed onto wafer surface 44 to form primary image 36 thereon, while secondary light beam 62 is scanned according to a scan profile as discussed above to scan secondary image 66 over at least a portion of the primary image to form modified line image 36'.

Figure 12:
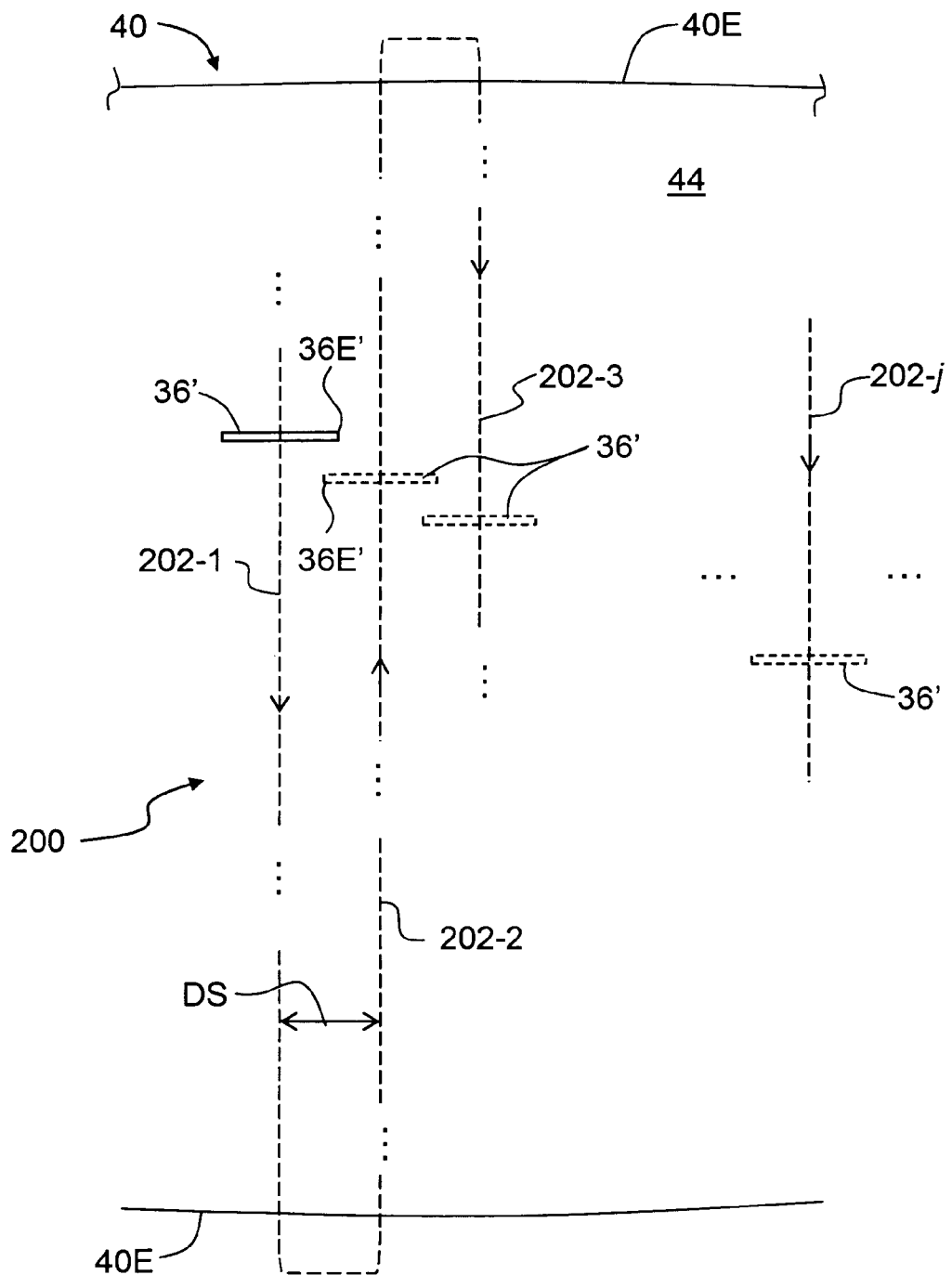
FIG. 12 is a plan view of a section of a semiconductor wafer illustrating an example wafer scan path for the scanning modified line image over the wafer surface, with the wafer scan path having adjacent linear scan path sections that are separated by a stepping distance DS that results in some overlap of the edges of the modified line images for adjacent linear scan path sections.

In an example embodiment, modified line image 36' is scanned over wafer surface 44, as indicated by arrow 180. FIG. 12 is a schematic diagram of an example wafer scan path 200 (dashed line) over which modified line image 36' is scanned. Wafer scan path 200 includes a number n of linear scan path sections 202-1, 202-2, ... 202-j ... 202-n. Adjacent linear scan path sections (e.g., 202-j and 202-j+1) are formed by stepping modified line image 36' by a stepping distance DS from one linear scan path to the next. Stepping distance DS is usually less than line-image length $L_{1Y}$ so that there is at least some overlap between line images for adjacent scan path sections 202. The amount of this line-image overlap for conventional laser annealing systems versus those disclosed herein is discussed in greater detail below.

Scanning modified line image 36' over wafer scan path 200 results in rapid heating of the wafer surface (down to a depth of about 1 micron or less) up to a temperature (e.g., between 1000° C. and 1,300° C.). This is sufficient to activate dopants in the source and drain regions 150S and 150D, while also allowing for rapid cooling of the wafer surface so that the dopants do not substantially diffuse, thereby maintaining the shallowness of the source and drain regions.

A typical scan velocity of modified line image 36' over wafer surface 44 for linear wafer scan path sections 202 ranges from 25 mm/sec to 1000 mm/sec. In an example, one or both of modified line image 36' and wafer 40 can move during scanning to define wafer scan path 200.

Throughput Enhancements

Laser annealing in semiconductor processing requires very precise temperature control over the entire region being annealed. Most often, the peak temperature drives the annealing process.

Figure 13A:
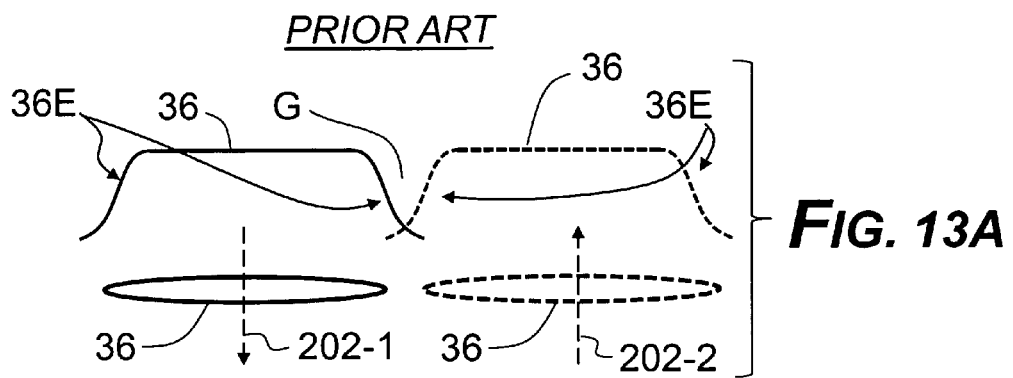
FIG. 13A is a schematic diagram of the line image intensity and corresponding line images for conventional line images (solid and dashed lines) associated with adjacent scan path sections of a wafer scan path when performing laser annealing, illustrating how an intensity gap can form when the line images are not substantially uniform along the long axis and when the adjacent scan path sections provide no line-image overlapped.

With reference to FIG. 13A, in the cases where the annealing beam forms a line image 36 that is non-uniform in the long-axis direction, and particularly at line image ends 36E, a gap G can form between adjacent scan sections 202 of wafer scan path 200, resulting in portions of the underlying wafer 44 (FIG. 11) not being fully exposed if the stepping distance DS is too great. A gap G will generally occur if the stepping distance $DS=L_{1Y}$, i.e., the stepping distance is the same as the length of line image 36.

It is noted here that in an example, line image length $L_{1Y}$ is defined by the distance in the long-axis direction over which laser annealing takes place when the line image is scanned over the wafer. This measure usually corresponds to a given intensity threshold in the line image and depends on the line-image scanning speed (or equivalently, the dwell time $t_d$).

Figure 13B:
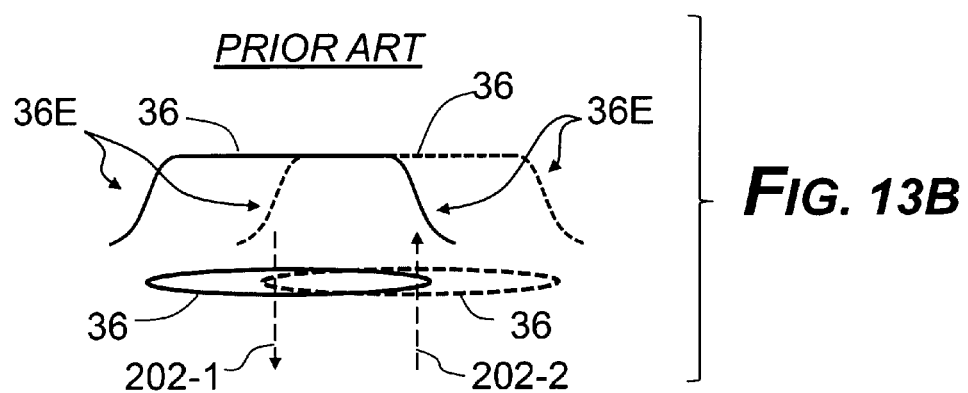
FIG. 13B is similar to FIG. 13A and shows a 50% line image overlap in the long-axis direction for adjacent scan path sections for a conventionally formed line image.

Thus, it is generally necessary to overlap line images 36 for adjacent scan sections 202 of wafer scan path 200 to improve annealing uniformity over wafer 40. In a conventional laser annealing system, line image 36 is "stepped" by half its length $L_{1Y}$ or less (i.e., $DS \leq L_{1Y}/2$, or at least 50% overlap) between adjacent path sections 202 so that each point on the wafer is scanned twice by the line image. This is schematically illustrated in the FIG. 13B, which shows two overlapping long-axis line image profiles and line images for adjacent scans path sections 202 for a conventional line image 36 having substantial intensity non-uniformity at its ends 36E. Unfortunately, by having to substantially overlap the line images for adjacent scan path sections, wafer throughput is reduced.

By way of example, consider a 10 mm long line image 36 and a 5 mm stepping distance DS between adjacent scan path sections of the wafer scan path 200 (i.e., 50% line-image overlap). Laser annealing a 300 mm wafer requires (300 mm)/(5 mm)=60 steps. For a smaller stepping distance DS=2.5 mm (i.e., 75% line-image overlap), each point on the wafer is annealed four times and the wafer scan path 200 requires 120 steps.

Figure 13C:
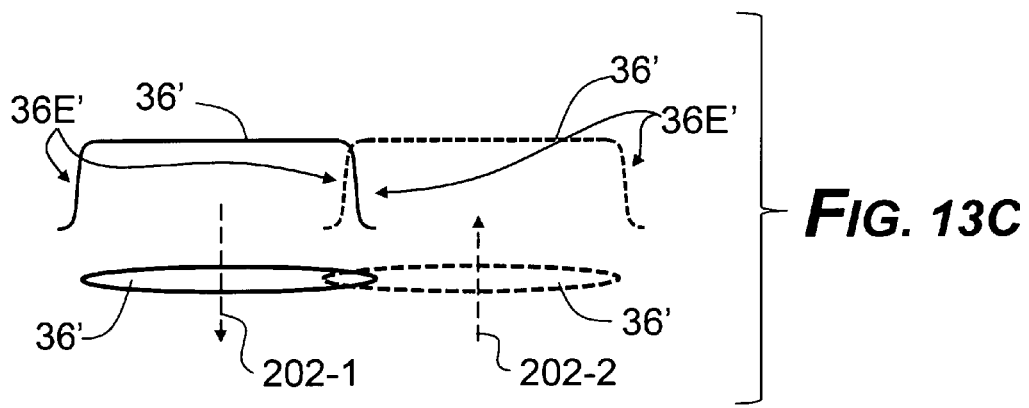
FIG. 13C is similar to FIG. 13B but shows the intensity profiles and line images for a modified line image for adjacent scan path sections of the wafer scan path, wherein the amount of overlap needed is much less than for the conventionally formed line image of FIG. 13B.

With reference to FIG. 13C, modified line image 36' can be formed to have much steeper intensity profiles at edges 36E' so that that substantially less overlap of line images 36' for adjacent scan path sections 202 is required. Throughput is thus improved by increasing the stepping distance DS between adjacent scan path sections to be much closer to the full length $L_{1Y}$ of modified line image 36'.

In an example, the amount of overlap required between adjacent scan path sections 202 for modified line image 36' is less than 50% and can be a small as 5% (i.e., $L_{1Y}/20 \leq DS \leq L_{1Y}/2$). A typical line-image overlap range for modified line image 36' is 5% to 10% (i.e., $L_{1Y}/20 \leq DS \leq L_{1Y}/10$) Thus, for a 10 mm length for modified line image 36', the stepping distance DS can be as large as 9.5 mm, resulting in only 32 steps for laser annealing a 300 mm wafer.

Wafer throughput in laser annealing is directly related to the number of steps between adjacent scan path sections in the wafer scan path 200. A typical "step and scan" for wafer scan path 200 takes about 1 second. Thus, for the above laser annealing examples, a conventional laser annealing system requires between about 60 seconds and 120 seconds to laser anneal a wafer for a line-image overlap between 50% and 75%. In contrast, the laser annealing system of the present disclosure takes between about 32 seconds and 34 seconds for a line-image overlap of between 5% and 10%. Thus, wafer throughput for laser annealing can be increased by close to 2× by performing the annealing process using modified line image 36'.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A line-image-forming optical system, comprising:
 a primary laser system configured to provide a first laser beam;
 a beam-conditioning optical system having an image plane and configured to receive the first laser beam and form therefrom a line image at the image plane, the line image having a long axis and a first amount of intensity non-uniformity along the long axis;
 one of: a) a secondary laser system that generates a second laser beam, and b) a beam-splitting optical system configured to provide the second laser beam from a portion of the first laser beam; and
 a scanning optical system configured to receive the second laser beam and form therefrom a secondary image at the image plane, wherein the secondary image at least partially overlaps the line image and is scanned over at least a portion of the line image to form a time-averaged modified line image having a second amount of intensity non-uniformity that is less than the first amount.

2. The system of claim 1, further comprising a controller operably connected to the secondary laser system and the scanning optical system, the controller configured to control at least one of a) an amount of intensity in the second laser beam and b) a scanning speed of the secondary image relative to the line image.

3. The system of claim 2, wherein the secondary image has a substantially fixed intensity and the scanning speed varies with position along the long axis.

4. The system of claim 2, wherein the scanning speed is substantially constant and the secondary image has an intensity that varies with position along the long axis.

5. The system of claim 1, further comprising:
 a workpiece having a surface arranged substantially in the image plane;
 a thermal emission detection system arranged to capture an emission image of the line image formed on the workpiece surface and generate electrical signals representative of the emission image; and
 wherein the controller is configured to receive and process the electrical signals to form a scan profile for scanning the secondary image that includes at least one of: a) a substantially constant intensity and a selectively varied scanning speed, and b) a selectively varied intensity and a substantially constant scanning speed.

6. The system of claim 5, wherein the controller is configured to perform low-pass filtering of the electrical signals.

7. The system of claim 5, wherein the workpiece comprises a semiconductor wafer.

8. The system of claim 5, further comprising an adjustable attenuator arranged so that the second laser beam passes therethrough and operably connected to the controller to provide said selectively varied intensity.

9. The system of claim 1, wherein the first and second laser beams have substantially the same wavelength.

10. The system of claim 1, wherein at least one of the primary and secondary laser systems includes a $CO_2$ laser.

11. The system of claim 1 for performing laser annealing of a semiconductor wafer having a surface, further wherein the line image is scanned over the wafer surface over a wafer scan path and has a dwell time $t_d$, and wherein the secondary image has a scanning time $t_3$ that is about the same as or shorter than the dwell time $t_d$.

* * * * *